United States Patent
Paule et al.

(10) Patent No.: US 10,025,883 B2
(45) Date of Patent: Jul. 17, 2018

(54) METHOD FOR GENERATING A CONFIGURATION FOR A CONTROL UNIT TEST SYSTEM

(71) Applicant: dSPACE digital signal processing and control engineering GmbH, Paderborn (DE)

(72) Inventors: Juergen Paule, Hildrizhausen (DE); Juergen Klahold, Brakel (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 192 days.

(21) Appl. No.: 14/187,847

(22) Filed: Feb. 24, 2014

(65) Prior Publication Data
US 2014/0244231 A1 Aug. 28, 2014

(30) Foreign Application Priority Data
Feb. 22, 2013 (EP) ..................... 13156323

(51) Int. Cl.
*G06F 17/50* (2006.01)
*G05B 23/02* (2006.01)

(52) U.S. Cl.
CPC ......... *G06F 17/50* (2013.01); *G05B 23/0208* (2013.01); *G05B 23/0213* (2013.01); *G05B 2219/23446* (2013.01); *Y02T 10/82* (2013.01)

(58) Field of Classification Search
CPC .............. Y02T 10/82; G05B 23/0208; G05B 23/0213; G05B 2219/23446; G06F 17/50
(Continued)

(56) References Cited

U.S. PATENT DOCUMENTS 6,115,774 A 9/2000 Ezawa et al.
6,526,332 B2 2/2003 Sakamoto et al.
(Continued)

FOREIGN PATENT DOCUMENTS

CN 101149622 A 3/2008
CN 101441473 A 5/2009
(Continued)

OTHER PUBLICATIONS

Japanese Office Action for Japanese Application No. 2014-032725 dated Nov. 30, 2015 with partial English translation.
(Continued)

*Primary Examiner* — Eunhee Kim
(74) *Attorney, Agent, or Firm* — Muncy, Geissler, Olds & Lowe, P.C.

(57) ABSTRACT

A method for performing configuration of a control unit test system with hardware components connected thereto, wherein control units can be tested with the test system in an environment simulated by the test system by means of a model, and wherein the test system comprises at least one computer, in particular a computer executing the model, as well as hardware components, connected to one another by means of at least one network, in which at least a portion of the hardware components comprises a dedicated server (MIS) that, by means of communication, provides access to the configuration data associated with the hardware component, in particular stored in the hardware component, and the model and/or the hardware component is adapted, in particular configured, as a function of the configuration data that are made accessible.

18 Claims, 1 Drawing Sheet

(58) Field of Classification Search
USPC .................................................. 703/6–8, 13
See application file for complete search history.

(56) References Cited

U.S. PATENT DOCUMENTS

| | | | |
|---|---|---|---|
| 6,915,330 B2 | 7/2005 | Hardy et al. | |
| 7,293,117 B2 | 11/2007 | Ohta | |
| 7,933,734 B2 | 4/2011 | Bruski et al. | |
| 7,945,614 B2 | 5/2011 | Ebata et al. | |
| 8,209,151 B2 | 6/2012 | Gruaz et al. | |
| 8,290,755 B2 | 10/2012 | Bruski et al. | |
| 8,433,953 B1* | 4/2013 | Gaudette | G06F 11/263 702/123 |
| 8,707,017 B2* | 4/2014 | Hernandez | G06F 11/1415 711/162 |
| 9,009,013 B2* | 4/2015 | Krainz | G05B 17/02 703/13 |
| 9,110,496 B1* | 8/2015 | Michelsen | G06F 1/00 |
| 2002/0173879 A1 | 11/2002 | Sakamoto et al. | |
| 2004/0030880 A1 | 2/2004 | Kitagawa | |
| 2005/0034465 A1 | 2/2005 | Borchers et al. | |
| 2006/0282248 A1 | 12/2006 | Kageyama et al. | |
| 2007/0199076 A1* | 8/2007 | Rensin | H04L 29/06027 726/27 |
| 2007/0255482 A1* | 11/2007 | Fukuda | G05B 17/02 701/99 |
| 2008/0071935 A1 | 3/2008 | Ohta | |
| 2008/0091279 A1 | 4/2008 | Biermann et al. | |
| 2008/0154957 A1 | 6/2008 | Taylor et al. | |
| 2010/0293080 A1* | 11/2010 | Shah | G06F 8/34 705/34 |
| 2013/0138942 A1 | 5/2013 | Klose et al. | |

FOREIGN PATENT DOCUMENTS

| | | |
|---|---|---|
| CN | 102262695 A | 11/2011 |
| CN | 202183035 U | 4/2012 |
| CN | 202183045 U | 4/2012 |
| CN | 102520711 A | 6/2012 |
| CN | 102880171 A | 1/2013 |
| DE | 10 2011 087 382 A1 | 6/2013 |
| EP | 1 168 768 A1 | 1/2002 |
| EP | 1 235 168 A2 | 8/2002 |
| EP | 1 806 636 A1 | 7/2007 |
| JP | S 62-100957 A | 5/1987 |
| JP | H 10-54868 A | 2/1998 |
| JP | H 10-63704 A | 3/1998 |
| JP | H 11-26095 A | 1/1999 |
| JP | 2002-113675 A | 4/2002 |
| JP | 2004-361292 A | 12/2004 |
| JP | 2005-048764 A | 2/2005 |
| JP | 2006-350549 A | 12/2006 |
| JP | 2007-058433 A | 3/2007 |
| JP | 2009-134699 A | 6/2009 |
| JP | 2009-294745 A | 12/2009 |
| JP | 2010-256354 A | 11/2010 |
| JP | 2011-252805 A | 12/2011 |
| JP | 2011252805 A | 12/2011 |
| WO | WO 2004/114712 A1 | 12/2004 |

OTHER PUBLICATIONS

Japanese Office Action for Japanese Application No. 2014-031584 dated Nov. 30, 2015 with partial English translation.
European Search Report for European Application No. 13000867.5 dated Oct. 11, 2013 with English translation.
Japanese Office Action for Japanese Application No. 2014-031584 dated Jun. 13, 2016 with English translation.
Chinese Office Action for Chinese Application No. 201410048606.2 dated Mar. 3, 2016 with English translation.
Chinese Office Action for Chinese Application No. 201410048369.X dated Mar. 30, 2016 with English Translation.
Tao Deng, "Hardware-in-the-Loop Simulation Research on Continuously Variable Transmission in Driver-Vehicle-Road Closed Loop System," Thesis for Chongqing University, pp. 1-165 with English translation of pp. 121-127 (pub. Jun. 15, 2011).
Zheng Wei, "Development of New Generation of Hardware-in-the-Loop Simulation Platform," Dissertation for Tsinghua Univ., pp. 1-111 with English translation (pub. Dec. 15, 2011).
Xiaolei Che, "Research on Hardware-in-the-Loop Testing System for Automotive Powertrain ECU," Thesis, pp. 1-132 with English translation (pub. May 15, 2012).
Extended European Search Report for European Application No. 13156323.1 dated Jan. 3, 2017 with English translation.
Chinese Office Action for Chinese Application No. 201410048606.2 dated Mar. 9, 2017 with English translation.

* cited by examiner

METHOD FOR GENERATING A CONFIGURATION FOR A CONTROL UNIT TEST SYSTEM

This nonprovisionalq application claims priority under 35 U.S.C. § 119(a) to European Patent Application No. EP 13156323.1, which was filed on Feb. 22, 2013, and which is herein incorporated by reference.

BACKGROUND OF THE INVENTION

Field of the Invention

The present invention relates to a method for generating a configuration for a control unit test system with hardware components connected thereto, wherein control units can be tested with the test system in an environment simulated by the test system by means of a model, and wherein the test system comprises at least one computer, in particular a computer executing the model, as well as hardware components, that are connected to one another by means of at least one network.

Description of the Background Art

Test systems for performing control unit tests are known in the prior art. For example, control units for motor vehicles can be tested, as well as control units for other devices such as, e.g., automated production equipment such as robots, or even for other transport means, as for example airplanes. All of these devices have largely in common that they have at least one control unit to be tested that acquires environmental data, or data from sensors interacting with the environment, and responds thereto.

In order to verify the (error-free) functioning of control units, a method is used that is also called "hardware-in-the-loop" and in essence dictates that an actual existing electronic control unit is tested, for which purpose this control unit is integrated into a test system that includes at least one computer that simulates a test environment, for example with the aid of a model that is stored and executed therein, and also includes additional hardware components that are connected to one another for the purpose of communication, which can take place, for example, via at least one network, in particular a network designed as a bus.

Examples of typical hardware components, which include the control unit to be tested itself, could be cable harnesses, mechatronic components, actual loads, as well as other electronics required to perform an individual test, for example ND converters, interfaces, etc.

Especially by means of actual loads, it is possible to take into account that under some conditions in a test that is to be performed certain environmental conditions, such as external influences on a control unit, may not be provided by a model in a simulation; consequently, in such a case actual, real loads are connected to the test system, for example actuators, sensors, or other data generators, especially actual hardware components of a system into which a control unit is incorporated for its later operation.

One concrete example from the motor vehicle field is the attachment of a throttle valve to the test system, since this component exhibits a behavior that is difficult to impossible to capture in simulation. Other actual loads, such as a steering system or a gas, brake, or clutch pedal, for example, can likewise be connected, even if they can be simulated in principle.

A concrete test can provide, for example, that the inputs of a control unit are simulated with sensor data from a model, or alternatively, if such sensor data cannot be obtained from a model by simulation, are simulated through data from the aforementioned real components.

The reaction to such data by a control unit to be tested can be accomplished by reading back output data of the control unit into the model or the computer executing the model and can thus be checked, which is to say tested. It is an advantage that such a test system can simulate an environment for the control unit to be tested essentially in real time, so that the control unit can be tested as though it were actually installed in the device in which it is intended to be used later. In order to permit real time capability, simulation cycles can have a preferred duration of less than 1 ms.

Potential errors in a control unit can be detected early by means of such a test system, in particular can be reproduced through repetitive simulation sequences, and the correction of discovered errors can be verified, in particular through repetition of the test sequences that led to the error.

It is critical to the error-free function of a test system that the configuration of the test system has also been performed correctly. Such a configuration, which is to say the assembling of the individual hardware components of the test system and the incorporation of such hardware components in a model to be executed, is performed largely manually, with the result that susceptibility to errors of the test system, in particular the model executed therein, also results from incorrect hardware components being used in a programmed model during configuration, or from an incorrect model, or at least an incorrectly configured or parameterized model for the given hardware components, being assembled or programmed.

For example, if a certain test, which is to say a certain environmental condition or interaction of a control unit with the simulated environment, is to be tested, an error can be caused simply by the fact that a model is used in the simulation that expects data that are not provided by the hardware components, or that processes these data in a manner that is not appropriate for the applicable hardware components.

For example, if a throttle valve controller for a 6-cylinder engine that is implemented in a control unit is to be tested by means of a test system, it is evident that this test cannot be performed correctly if configuration or parameterization of the model that is employed takes place for a 4-cylinder throttle valve.

The susceptibility to error of a manually configured test system, in particular the configuration or parameterization of the model, can be reduced, for example, if a means is created for communicating the technical requirements that a hardware component places on the test system, and here in particular on the model to be executed, to the test system in an automated manner.

SUMMARY OF THE INVENTION

It is therefore an object of the present invention to provide a method for configuring a control unit test system, and here in particular the model to be executed therein, that largely excludes human influences as sources of error and that automates the configuration, in particular in order to achieve higher process reliability.

In an exemplary embodiment, a method is to be provided that automatically creates, or at least contributes to, a configuration. Thus, it should also be ensured that errors occurring during a test can be traced back to a malfunction in the control unit rather than an error in the test system, in particular in the configuration of the model itself.

The model here can be understood to be, for example, a software item that is executed by the computer of a test system and that communicates with the individual hardware components connected to the test system in order to exchange data as part of the simulation of an environmental condition or surroundings.

The problem rooted in the prior art of the erroneous technical configuration of the model of a test system or of its hardware components can be solved in accordance with the invention by the means that at least a portion of the hardware components comprises a dedicated server that, by means of communication, provides access to the configuration data associated with the hardware components, in particular stored in the hardware components, and the model and/or the hardware components are adapted, in particular configured, as a function of the configuration data that are made accessible.

Accordingly, a concept of an embodiment of the method is based on the idea that in accordance with the invention at least a portion of the hardware components connected to the test system, preferably all hardware components, themselves carry or bring with them the configuration data that are required in the test system, in particular in a model in the test system, for performing a test in conjunction with this hardware component. In this regard, these configuration data that are required or exactly match the relevant hardware component are made accessible by means of a server that runs on or in this hardware component.

Here, a server can be understood to mean a software item or a program that communicates with another program—a program also called a client—in order to provide this other program with access to specific data or services.

Provision may be made here that at least all those hardware components that are to be viewed as simulation-specific, which is to say those for which a failure to correctly account for them individually in the model of the test system directly affects the simulation result or the correctness of the test result, are or will be provided with a server.

Accordingly, in a test system for performing tests with control units it is certainly possible for hardware components to be present that can be used in general for every type of simulation and test of control units, and thus are not simulation-specific, so that such hardware components are correctly functional in general within a test system regardless of the simulation to be performed or the model, and hence a model does not require any individual adaptation or configuration.

Consequently, no incorrect configuration of the model or erroneous incorporation into a test system can occur for such hardware components, so that provision can be made if applicable to use such hardware components without a server function in the test system.

At least hardware components that require special adaptation, or require configuration of the model or in and of themselves, are equipped with servers. One example is the 6-cylinder throttle valve mentioned at the outset, which represents a hardware component to be categorized as an actual load, and which would result in a malfunction in a model programmed only for a 4-cylinder throttle valve, which malfunction would then be traceable back to an erroneous model programming, but not a defective control unit.

In this example, a point is thus to achieve a correct pairing within the test system of the control unit, actual load, and the model that processes the data therefrom.

Provision can be made in accordance with the invention that those configuration data that are required for execution of the model or communication with the hardware component during a simulation are read out from the hardware component within the framework of access provision through communication with the server. Consequently, the configuration data can be used, for example, to adapt or change the model of the test system that runs on the computer of the test system. Alternatively or in addition, the configuration data can also be used to configure the relevant hardware component that includes the server.

In this regard, provision can also be made in accordance with the invention for the applicable readout of the configuration data from the individual hardware components, in particular the simulation-specific hardware components, to take place by means of the computer of the test system that also performs the actual simulation using the model, which is to say a simulation algorithm to be performed that is present primarily on the computer.

Alternatively, it is also possible to read the individual configuration data from the relevant hardware components by means of a control computer connected to the test system, for example a control computer of this type by means of which a software configuration of the test system is otherwise performed as well.

For example, by means of such a control computer the model, which is to say the software simulating a particular environmental condition, can be transferred to the computer of the test system and/or can be provided with parameters required for the simulation. It is likewise possible by means of such a control PC to read results out of the test system and if applicable to visualize them, in particular for monitoring of the test system by users.

Regardless of which of these computers is used, the readout can require a client process to be executed on the relevant computer that communicates with the server of the hardware component in order to obtain access to the configuration data through this server.

When readout by means of a control computer connected to the test system takes place, this control computer can then carry out the configuration of the model running on the computer of the test system, and can also perform configuration of the individual hardware components, on the basis of all configuration data obtained from multiple hardware components.

Typical configuration data can be composed, for example, of a model component that can be executed by the computer of the test system, in particular a Simulink component. Configuration data items can thus themselves also constitute pieces of software that are required to run on the test system when using the specific hardware component whence the configuration data originate.

Alternatively or in addition, the configuration data can also include parameters or characteristic curves of a model or model component, for example, or even an item of information describing the hardware component.

In addition to the capability, central to the invention, for configuration data to be provided by the hardware components themselves for the purpose of adapting the test system, in particular the model or the hardware component, a further development can also make provision that a server of a hardware component also grants access to information identifying the hardware component, in particular a serial number, in particular for carrying out an inventory of the hardware components of the test system. Such an inventory, which is to say, for example, a stored list reflecting identifying component information, can be visualized by means of the said control computer, for example.

An embodiment of the method in accordance with the invention can provide that the server of a hardware component is implemented by a software item that is executed by a processor used for the function of the hardware component during a test. Thus, the processor works during a simulation not only for the purpose of simulation, in particular in such a manner that the simulation is not possible without this processor, but also for the configuration performed here in accordance with the invention. This is also the case, for example, for a processor on which process steps are carried out during the execution of a test.

Another embodiment, which can also be combined with the foregoing embodiment, can provide that the server is implemented by a software item that is executed on a server hardware item that is not required for the function of the hardware component during a test, in particular that comprises a processor that is located on the hardware component for the purpose of providing the server.

In an embodiment, such a server hardware item may have no other function than providing the server, and otherwise have no additional function at least for the execution of a test as part of a simulation, or in other words does not participate in the test itself.

In this embodiment, it has proven to be advantageous that hardware components that may have no processor can be specifically equipped for the purposes of the method in accordance with the invention, for example by attaching an additional server hardware item to the hardware component, in order to then read out the configuration data via the server thus implemented, and to use the data within the framework of adapting the test system.

Another embodiment of the method in accordance with the invention can also provide here that, when a hardware component is used that either has no processor or cannot be retrofitted with a server hardware item, a server hardware item implementing the server for this hardware component is integrated into a connecting element provided for connecting this hardware component to the test system, in particular in a connecting plug of such a connecting element, as for example of a cable harness, in particular wherein activation of the function of the server first takes place by means of a connection between this hardware component and the connecting element. Such a hardware component can be a control unit, for example.

For instance, the applicable hardware component and the connecting element can be connected to form a new unit, in particular a unit that cannot be separated nondestructively.

This can be accomplished by means of a screwed or sealed connection, for example.

Provision can additionally be made when carrying out the method in accordance with the invention for the configuration data to be communicated between the server and the computer in question over the same network that the hardware component uses to communicate with the computer executing the model during the simulation.

Provision can also be made that a portion of the hardware components of the test system is connected, for example to a first bus on the computer of the test system, by means of a first network, and that a (different) portion of the hardware components of the test system, such as a control unit to be tested and/or actual loads, is connected, for example to a second bus on the computer of the test system, by means of a second network, wherein the two networks, in particular the buses used, are connected by means of a gateway, thus exploiting the possibility of transmitting signals or data on one of the two networks to the other respective network or to the other bus, in particular wherein such a gateway can undertake, for example, a protocol transformation if the two networks or buses work with a different communications protocol.

For example, provision can be made here for a network to be employed as the first network that is used as proprietary by a manufacturer of at least the computer of the test system and, if applicable, also of mandatory components, in particular non-simulation-specific components, provided for the test system, whereas in contrast a standardized network may possibly be used as a second network in order to connect additional components, in particular external components, such as the aforementioned control units or external (actual) loads to the computer of the test system through such a network or a standardized bus.

As an example, the network or the bus IOCNET from the applicant of this invention can be used for a first network, while e.g. the CAN bus established in the automotive industry can be employed as the second network. It must be noted that the invention described herein is not limited to the specific networks or buses mentioned herein, but that other networks or buses can also be employed as well.

Due to the use, as described, of a gateway to connect the at least two networks, it is possible to ensure in this way that even configuration data from hardware components connected to the second network can be read out directly through the second network by a given hardware component and, for example, transmitted through the gateway, in particular a first gateway, to the first network, in particular the network in which the computer of the test system is located so that the configuration data are available at least to this computer for the purpose of adapting the test system, or can also be transmitted over this network to a control computer connected to the test system for the same purpose. This presupposes that a processor or a server hardware item, whether it be original equipment or retrofitted, is connected to at least one of the at least two said networks (buses).

If, in contrast, a server of a hardware component integrated in the test system cannot be addressed either through the aforementioned first network or through the aforementioned second network, which can be the case, for example, if a hardware component is involved on which is located, for the purpose of providing a server, a server hardware item of no significance for the function of the hardware component during a test, then provision can also be made to communicate the applicable configuration data between the server and the computer in question over a network that is separate from the particular network that the hardware component uses to communicate with the computer executing the model during the simulation. At least the computer in question is then incorporated in at least two separate networks, one for the server communication and one for the communication during a simulation.

In a simple case, such a separate network for the server communication can be an Ethernet.

The embodiment using such a separate network is advantageous because the act of performing the communication in accordance with the invention between the server and computer does not disrupt a simulation, which is to say that it does not disrupt a test of a control unit, even if a transmission of configuration data is carried out during the run time of a test.

Real-time requirements on the test system can thus be adhered to continuously during performance of a test without difficulty, without the need to be concerned about influence by the server communication in accordance with the invention.

According to an embodiment of the invention, provision can also be made that a server grants access to at least one memory location with public data and/or to at least one memory location with non-public data, in particular after the server has performed authentication of a querying computer.

Independently of any potential access restriction, a memory location can be composed of a flash memory, for example, that is already provided on the hardware component for proper functioning during a test or that is located on a separate server hardware item.

A further development can also provide that a client, in particular a client designed as software, is implemented in each of the separate server hardware items of multiple hardware components or directly in multiple hardware components of the test system, wherein multiple servers of different hardware components are networked with one another by means of the applicable client, which communicate configuration data to one another, in particular wherein a participating computer, through communication with only one of the networked servers, obtains access to the configuration data of the other servers networked with this server.

Moreover, a server can include a web server functionality by which means changes can be made in the data that are made accessible through the server, in particular through use of the control computer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
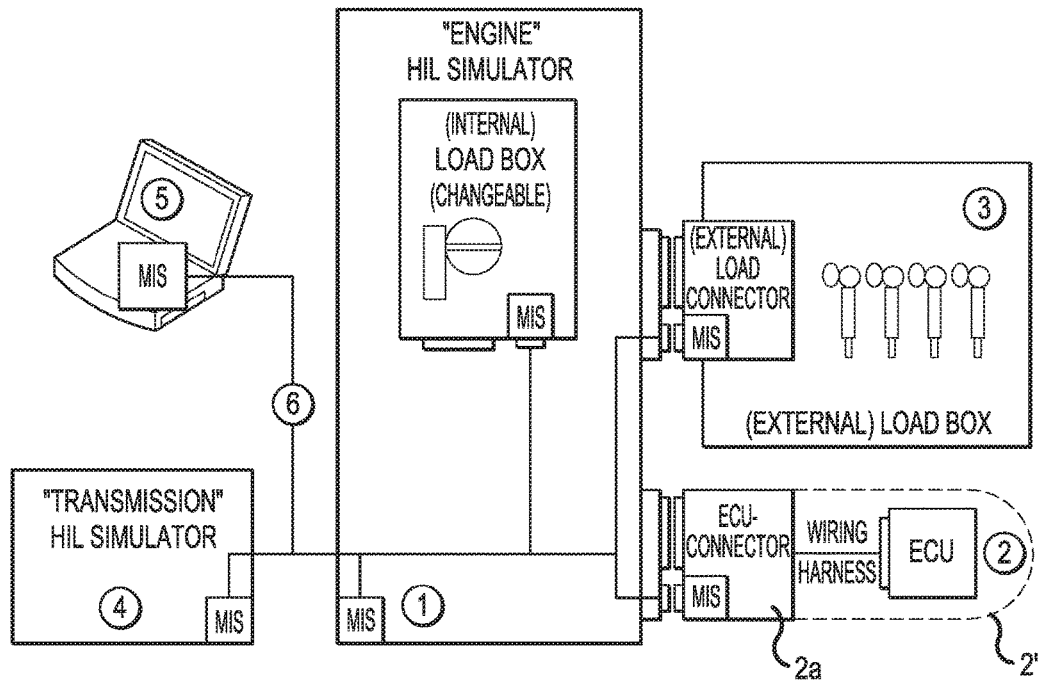
FIG. 1 shows a block diagram according to an embodiment of the present application.

FIG. 1 shows, in an overall view in the form of a block diagram, a test system 1 for performing a test of a control unit 2, in which an environment is simulated for a control unit 2 by means of a simulation architecture, in particular an environment such as is also present in the actual use of the control unit 2 in a later device, as for example a motor vehicle.

The simulation architecture can already comprise multiple hardware components, for example a computer—not shown here—of the test system 1 and can be implemented, for instance, through a proprietary system of a particular manufacturer. In the present case, a system of the patent applicant is shown in which multiple hardware components 2, 3, 4 can communicate with one another over a network 6; these components are connected to the test system 1, upon which the computer, not shown, simulates a test environment.

Here, the hardware components 2, 3, 4 can be incorporated in the network 6, e.g. through intelligent nodes or routers, in particular if they do not themselves have suitable network interfaces.

In addition, a control computer 5 can also be provided that is connected to the test system through the same first network 6, for example in order to parameterize the test system or to load and start the requisite software or a model, or to communicate with the test system for other reasons.

Provision is made here for the inventive method that at least the simulation-specific components 2, 3, 4 and possibly also the computer of the test environment or the combined proprietary hardware of the test environment 1 and also the control computer 5 include a server, which here is shown as a MIS, an abbreviation for Micro Information Server.

This server is implemented in software, either directly on the hardware component 2, 3, 4 or also 1, 5 itself, or in a separate server hardware item located thereon. The applicable server MIS can communicate through the same network 6 with a client on the computer of the test system 1 or a client on the control computer 5, and in this way obtain access to configuration data that are required during execution of the model with the applicable hardware component. In this way, adaptation of the model as a function of the configuration data can take place after a transmission of the configuration data to the control computer 5 or the computer of the test system 1.

With regard to the control unit 2, it is shown that this has no server of its own, but is connected to the test system 1 through a connecting element 2a, wherein the connecting element has a server MIS and thereby constitutes a new unit 2' with the server MIS.

Figure 2:
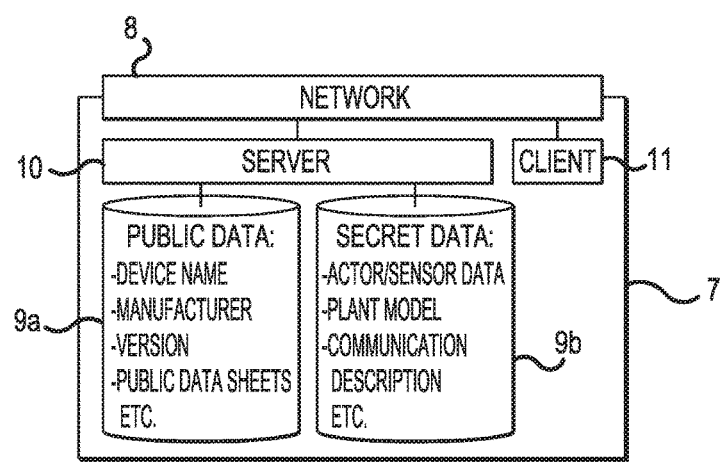
FIG. 2 shows a structure of a micro information server.

FIG. 2 shows a server hardware item 7 that can be arranged on the hardware components separate therefrom, or can also be implemented through a portion of the hardware components. It is evident here that this server hardware item 7 includes a network interface 8, for example in order to communicate with the same network 6 through which the communication is performed during the simulation or to communicate with another separate network.

An embodiment shown here provides that two memory areas 9a, 9b that are at least logically and possibly also physically separated, are provided in the server hardware 7; public and non-public configuration data, or additional data as well, can be kept available in these memory areas, to which server software 10 running in the server hardware 7 provides access. This access takes place through the network interface 8 by means of a client, for example of the control computer 5, the test system computer, or also a client 11 that is implemented in a different server hardware item of a different hardware component. In this way, the individual hardware components 7 can be networked with one another through the network interface 8 and the individual server and client function present in each case, and can also exchange their data with one another. For example, one of the said computers can communicate only with one server 10 of one hardware component, but can also obtain access through this hardware component to the (configuration) data of other hardware components.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for performing a configuration of a control unit test system with hardware components connected thereto, the method comprising:
   testing control units with the test system in an environment simulated by the test system by a model, the test system comprising at least one computer executing the model and hardware components connected to one another by at least one network;
   providing a respective, dedicated server within each of at least two of the hardware components, such that at least a first server and a second server are provided, with the first server provided within and running within a first hardware component and the second server provided within and running within a second hardware component, the first server, via communication, provides access to configuration data associated with the first hardware component and stored in the first hardware component and the second server, via communication, provides access to configuration data associated with the second hardware component and stored in the second hardware component; and
   configuring the model and/or the first and second hardware components as a function of the configuration data that are made accessible.

2. The method according to claim 1, wherein a readout of the configuration data from the first and second hardware components is accomplished by the computer of the test system or by a control computer connected to the test system.

3. The method according to claim 1, wherein the first server of the first hardware component and the second server of the second hardware component are each implemented by
   a. a software item that is executed by a processor used for the function of the respective hardware component during a test, or
   b. a software item that is executed on a server hardware item that is not required for the function of the respective hardware component during a test.

4. The method according to claim 3, wherein the configuration data of the first or second hardware component are communicated between the respective first or second server and the computer of the test system over the same network that the respective first or second hardware component uses to communicate with the computer of the test system executing the model during the simulation.

5. The method according to claim 3, wherein the configuration data of the first or second hardware component are communicated between the respective first or second server and the computer of the test system over a network that is separate from the network that the respective first or second hardware component uses to communicate with the computer of the test system executing the model during the simulation.

6. The method according to claim 1, wherein a server hardware item implementing the first or second server for the first or second hardware component, respectively, to be tested is integrated into a connecting element provided for connecting the first or second hardware component to the test system.

7. The method according to claim 1, wherein the respective first or second server grants access:
   a. to at least one memory location with public data; and/or
   b. to at least one memory location with non-public data, after the respective first or second server has performed authentication of a querying computer.

8. The method according to claim 1, wherein a client is implemented in each of the respective server hardware items of multiple hardware components or directly in multiple hardware components of the test system, wherein multiple servers of different hardware components are networked with one another by means of the respective client, which communicate configuration data to one another, such that a participating computer, through communication with one of the networked servers, obtains access to the configuration data of the other servers networked with this server.

9. The method according to claim 1, wherein the first and second server each include a web server functionality via which changes are made in the configuration data that are made accessible through the first and second server.

10. The method according to claim 1, wherein configuration data are composed of at least one type of the following data:
    a. a model component that is executable by a computer of the test system or a Simulink component;
    b. parameters or characteristic curves of a model; or
    c. an item of information describing the hardware components.

11. The method according to claim 1, wherein the server of each respective hardware component of the at least two of the hardware components grants access to information identifying the hardware components for carrying out an inventory of the hardware components of the test system.

12. The method according to claim 2, wherein, when the readout is performed by the control computer connected to the test system, the control computer then carries out the configuration of the model running on the computer of the test system and/or of the first and second hardware components on the basis of all configuration data obtained from the first and second hardware components.

13. The method according to claim 3, wherein the software item that is execute on the server hardware item that is not required for the function of the respective hardware component during the test comprises a processor that is located on the respective first and second hardware component for the purpose of providing the first and second server, respectively.

14. The method according to claim 6, wherein the connecting element is a connecting plug of a cable harness.

15. The method according to claim 9, wherein the changes made in the configuration data are made accessible through the first and second server, respectively, through use of a control computer.

16. The method according to claim 11, wherein the information identifying the hardware component includes a serial number of the hardware component.

17. The method according to claim 11, wherein a readout of the configuration data from the hardware components is accomplished by a control computer connected to the test system, and
    wherein the control computer has a respective, dedicated server provided therein and the at least one computer of the test system has a respective, dedicated server provided therein, such that the control computer is provided with a third server therein and the at least one computer of the test system is provided with a fourth server therein.

18. A method for performing a configuration of a control unit test system with hardware components connected thereto, the method comprising:
    testing control units with the test system in an environment simulated by the test system by a model, the test system comprising at least one computer executing the model and hardware components connected to one another by at least one network;

providing a first server running on or in a first hardware component that, via communication, provides access to first configuration data stored in the first hardware component, the first configuration data being required in the test system for performing a test in conjunction with the first hardware component;

providing a second server running on or in a second hardware component that, via communication, provides access to second configuration data stored in the second hardware component, the second configuration data being required in the test system for performing a test in conjunction with the second hardware component;

the first server being implemented by a software item executed on a server hardware item that is not required for the function of the first hardware component during a test; and configuring the model and/or the first and second hardware components as a function of the first and second configuration data that are made accessible.

* * * * *